(12) United States Patent
Umeda et al.

(10) Patent No.: US 11,510,349 B2
(45) Date of Patent: Nov. 22, 2022

(54) SHIELD PACKAGE AND METHOD OF MANUFACTURING SHIELD PACKAGE

(71) Applicant: Tatsuta Electric Wire & Cable Co., Ltd., Osaka (JP)

(72) Inventors: Hiroaki Umeda, Kyoto (JP); Hidetoshi Noguchi, Kyoto (JP); Hajime Nakazono, Kyoto (JP)

(73) Assignee: TATSUTA ELECTRIC WIRE & CABLE CO., LTD., Osaka (JP)

( * ) Notice: Subject to any disclaimer, the term of this patent is extended or adjusted under 35 U.S.C. 154(b) by 0 days.

(21) Appl. No.: 17/045,811

(22) PCT Filed: Jul. 1, 2019

(86) PCT No.: PCT/JP2019/026128
§ 371 (c)(1),
(2) Date: Oct. 7, 2020

(87) PCT Pub. No.: WO2020/021981
PCT Pub. Date: Jan. 30, 2020

(65) Prior Publication Data
US 2021/0076544 A1    Mar. 11, 2021

(30) Foreign Application Priority Data

Jul. 24, 2018 (JP) .............................. JP2018-138569

(51) Int. Cl.
*H05K 9/00* (2006.01)
*H01L 23/552* (2006.01)

(52) U.S. Cl.
CPC ......... *H05K 9/0045* (2013.01); *H01L 23/552* (2013.01); *H05K 9/0047* (2013.01); *H01L 2223/54413* (2013.01); *H05K 9/0084* (2013.01)

(58) Field of Classification Search
CPC ................ H05K 9/0045; H01L 23/552; H01L 2223/54413
See application file for complete search history.

(56) References Cited

U.S. PATENT DOCUMENTS

| 2006/0208765 A1 | 9/2006 | Juhola |
| 2012/0223335 A1 | 9/2012 | Tsuchiya |

(Continued)

FOREIGN PATENT DOCUMENTS

| CA | 2994340 A1 | 2/2017 |
| CN | 1513205 A | 7/2004 |

(Continued)

OTHER PUBLICATIONS

International Search Report dated Sep. 17, 2019, issued in International Application No. PCT/JP2019/026128.

(Continued)

*Primary Examiner* — Hung V Ngo
(74) *Attorney, Agent, or Firm* — United IP Counselors, LLC; Kenneth Fagin

(57) ABSTRACT

The present invention provides a shield package having a highly distinctive pattern formed on a surface of a shield layer. The shield package of the present invention includes a package in which an electronic component is sealed with a resin layer, and a shield layer covering the package, wherein a surface of the resin layer includes a drawing area drawn with lines and/or dots by aggregation of multiple grooves, and a non-drawing area other than the drawing area, multiple depressions originating from the grooves are formed on a surface of the shield layer on the drawing area, and the depressions are aggregated to draw a pattern with lines and/or dots.

8 Claims, 5 Drawing Sheets

(56) References Cited

U.S. PATENT DOCUMENTS

| | | | | |
|---|---|---|---|---|
| 2012/0290117 A1* | 11/2012 | Wang | ............... | H01L 23/544 |
| | | | | 700/286 |
| 2012/0295668 A1* | 11/2012 | Kitahara | ............ | H01L 21/56 |
| | | | | 455/571 |
| 2013/0294034 A1* | 11/2013 | Kanryo | ............ | H01L 21/568 |
| | | | | 29/841 |
| 2014/0284775 A1* | 9/2014 | Nomura | ............ | H01L 24/97 |
| | | | | 257/659 |
| 2017/0243831 A1* | 8/2017 | Butler | ............... | H01L 23/544 |
| 2018/0069710 A1* | 3/2018 | De Langen | ......... | G06F 21/44 |
| 2019/0259884 A1* | 8/2019 | Fukuda | ........ | H01L 31/022433 |
| 2021/0057232 A1* | 2/2021 | Pio | ................... | H01L 21/568 |

FOREIGN PATENT DOCUMENTS

| | | |
|---|---|---|
| CN | 101978492 A | 2/2011 |
| CN | 102653035 A | 9/2012 |
| CN | 102790019 A | 11/2012 |
| CN | 104064528 A | 9/2014 |
| CN | 104105387 A | 10/2014 |
| CN | 104064528 B | 6/2017 |
| CN | 107848345 A | 3/2018 |
| JP | H03124051 A | 5/1991 |
| JP | 2012243895 A | 12/2012 |
| JP | 2013235883 A | 11/2013 |
| JP | 2015015498 A | 1/2015 |
| WO | 2016181706 A1 | 11/2016 |
| WO | 2017170390 A1 | 10/2017 |

OTHER PUBLICATIONS

Written Opinion dated Sep. 17, 2019, issued in International Application No. PCT/JP2019/026128.

* cited by examiner (a)

(b)

(c)

(a)

(b)

(c)

(a)

(b)

SHIELD PACKAGE AND METHOD OF MANUFACTURING SHIELD PACKAGE

TECHNICAL FIELD

The present invention relates to a shield package and a method of producing a shield package.

BACKGROUND ART

Nowadays, electronic devices such as mobile phones and tablet terminals include many electronic components mounted thereon for wireless communication to transmit a large amount of data. These electronic components are provided as a package sealed with a resin layer.

Such electronic components for wireless communication are not only likely to generate noise but are also sensitive to noise, and are thus likely to cause a malfunction when exposed to external noise.

In addition, there is a demand to increase the mounting density of electronic components in order to provide smaller and lighter electronic devices with higher functionality. Yet, an increase in mounting density not only increases the number of electronic components that cause noise but also increases the number of electronic components affected by noise.

Conventionally known techniques include a shield package in which a whole package containing an electronic component that causes noise is covered with a shield layer to prevent generation of noise from the electronic component and to prevent intrusion of noise (Patent Literature 1).

In addition, in order to improve the distinctiveness of a package in which an electronic component is sealed with a resin layer, a method of laser marking a surface of the package has been conventionally employed (Patent Literature 2).

CITATION LIST

Patent Literature

Patent Literature 1: WO 2017/170390
Patent Literature 2: JP H03-124051 A

SUMMARY OF INVENTION

Technical Problem

An example method of improving the distinctiveness of a shield package is as follows.

First, a laser beam is applied to a resin layer of a package to etch a surface of the resin layer, whereby a groove is formed. Due to the laser etching, fine irregularities are formed on a bottom of the groove in the surface of the resin layer.

Next, a metal thin film is deposited on the resin layer by sputtering to form a shield layer. The shield layer has irregularities originating from the fine irregularities on the surface of the resin layer, whereby a distinctive pattern is formed.

The shield layer formed by sputtering has irregularities originating from the fine irregularities on the surface of the resin layer, and a pattern is formed with these irregularities. Thus, the boundary of the pattern is easily discernible. The shield layer formed by sputtering, however, shows poor reliability in a heat cycle test because the coefficient of linear expansion is different between the resin layer sealing an electronic component and the metal thin film. Further, the productivity is not sufficient because sputtering devices are expensive.

In addition, when a conductive coating material is applied to the surface of the resin layer by spraying, a leveling effect of the conductive coating material smooths the shield layer formed on fine irregularities of the grooves in the resin layer. As a result, the boundary of a portion to which the laser was applied may not be easily discernible, and the boundary of the distinctive pattern may be unclear.

The present invention was made to solve the above problems and aims to provide a shield package including a highly distinctive pattern formed on a surface of a shield layer.

Solution to Problem

Specifically, the present invention provides a shield package including:

a package in which an electronic component is sealed with a resin layer; and a shield layer covering the package, wherein a surface of the resin layer includes a drawing area drawn with lines and/or dots by aggregation of multiple grooves, and a non-drawing area other than the drawing area, multiple depressions originating from the grooves are formed on a surface of the shield layer on the drawing area, and the depressions are aggregated to draw a pattern with lines and/or dots.

In the shield package of the present invention, the multiple depressions are aggregated to draw a pattern with lines and/or dots on the surface of the shield layer.

The difference in brightness is large between the pattern drawn with lines and/or dots and a portion other than the pattern due to the difference in reflectance. Thus, the pattern has a clear boundary.

As a result, in the shield package of the present invention, the pattern is highly distinctive.

The term "pattern" as used herein encompasses not only simple patterns such as circles and triangles but also those that indicate distinctive information such as letters and marks.

The phrase "those that indicate distinctive information" encompasses not only those that are visually distinguishable but also those that are distinguishable by machines such as readers.

In the shield package of the present invention, at least some of the multiple grooves may each have a line shape.

Line-shaped grooves are easily formed by laser marking.

In the shield package of the present invention, preferably, at least some of the multiple grooves are formed linearly and in parallel to each other.

Linear and parallel grooves are simple shapes so that they can be efficiently formed.

In the shield package of the present invention, preferably, the grooves adjacent to each other are arranged at an interval of 10 to 100 μm.

When each interval between adjacent grooves is in the above range, the difference in brightness is clear between the pattern drawn with lines on the surface of the shield layer and the other portion.

When each interval between adjacent grooves is less than 10 μm, the number of grooves to be formed per unit area increases. Thus, it takes time to form the grooves and it is inefficient. In addition, the leveling effect of the conductive coating material makes the pattern less recognizable by a machine such as a reader.

When each interval between adjacent grooves is more than 100 μm, the intervals between the depressions formed on the surface of the shield layer are large, and there are fewer depressions per unit area. Thus, there are fewer depressions to draw the pattern.

As a result, the difference in brightness is small between the pattern on the surface of the shield layer and the other portion, making the pattern less distinguishable.

In the shield package of the present invention, at least some of the multiple grooves may be formed in a grid shape.

The grid-shaped grooves can be easily formed by laser marking crosswise.

In the shield package of the present invention, preferably, each cell of the grid formed by the grooves has a width of 10 to 100 μm.

When the width of each cell of the grid formed by the grooves is in the above range, the difference in brightness is clear between the pattern drawn with lines on the surface of the shield layer and the other portion.

When the width of each cell of the gird formed by the grooves is less than 10 μm, the number of grooves to be formed per unit area increases. Thus, it takes time to form the grooves and it is inefficient. In addition, the leveling effect of the conductive coating material makes the pattern less recognizable by a machine such as a reader.

When the width of each cell of the grid formed by the grooves is more than 100 μm, the intervals of the depressions formed on the surface of the shield layer are large, and there are fewer depressions per unit area. Thus, there are fewer depressions to draw the pattern.

As a result, the difference in brightness is small between the pattern on the surface of the shield layer and the other portion, making the pattern less distinguishable.

In the shield package of the present invention, preferably, each groove has a width of 5 to 100 μm.

When the width of each groove is in the above range, the difference in brightness is clear between the pattern drawn with lines and/or dots on the surface of the shield layer and the other portion.

When the width of each groove is less than 5 μm, the depressions are less likely to be formed on the surface of the shield layer. As a result, the difference in brightness is small between the pattern on the surface of the shield layer and the other portion, making the pattern less distinguishable. In addition, the leveling effect of the conductive coating material makes the pattern less recognizable by a machine such as a reader.

When the width of each groove is more than 100 μm, the width of each depression formed on the surface of the shield layer is large, and there are fewer depressions per unit area. Thus, there are fewer depressions to draw the pattern.

As a result, the difference in brightness is small between the pattern on the surface of the shield layer and the other portion, making the pattern less distinguishable.

In the shield package of the present invention, preferably, each groove has a depth of 5 μm or more.

When the depth of each groove is more than 5 μm or more, the depressions are clearly formed on the surface of the shield layer. Thus, the difference in brightness is clear between the pattern drawn with lines and/or dots on the surface of the shield layer and the other portion.

In the shield package of the present invention, preferably, the pattern is a two-dimensional code.

As described above, in the shield package of the present invention, the pattern is highly distinctive. Thus, when the pattern is a two-dimensional code, the code can be easily read with a machine such as a reader.

The present invention provides a method of producing shield package including a package in which an electronic component is sealed with a resin layer, and a shield layer covering the package, the method including:

a package preparing step of preparing a package in which an electronic component is sealed with a resin layer;

a drawing area forming step of forming multiple grooves by applying a laser beam to a surface of the resin layer in such a manner that the grooves are aggregated to draw a drawing area with lines and/or dots; and a shield layer forming step of applying a conductive coating material to the surface of the resin layer to form a shield layer, wherein the shield layer forming step includes forming depressions originating from the grooves in such a manner that the depressions are aggregated to draw a pattern with lines and/or dots.

The method of producing a shield package of the present invention can produce the shield package of the present invention.

Advantageous Effects of Invention

In the shield package of the present invention, the multiple depressions are aggregated to draw a pattern with lines and/or dots on the surface of the shield layer.

The difference in brightness is large between the pattern drawn with lines and/or dots and a portion other the pattern due to the difference in reflectance. Thus, the pattern has a clear boundary.

As a result, in the shield package of the present invention, the pattern is highly distinctive.

DESCRIPTION OF EMBODIMENTS

A shield package of the present invention is specifically described below. Yet, the present invention is not limited to the following embodiments, and changes and modifications may be made without departing from the gist of the present invention.

An aspect of the shield package of the present invention is described below with reference to the drawings.

Figure 1:
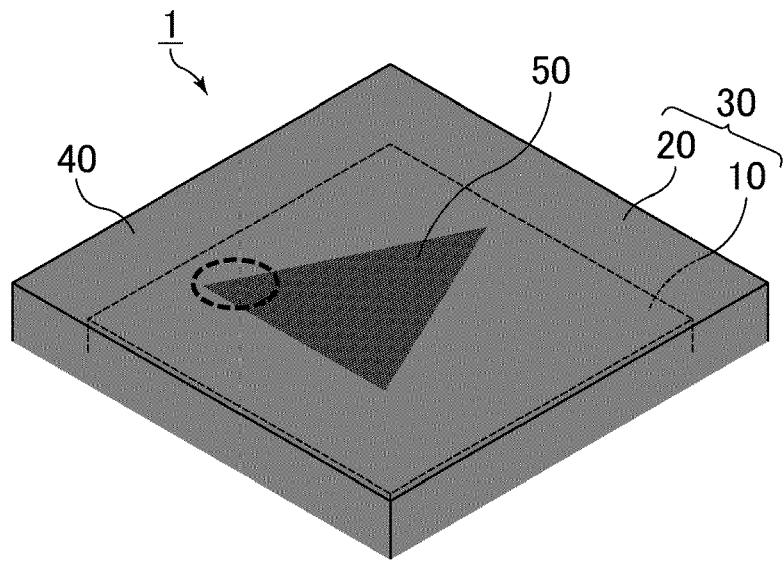
FIG. 1(a) is a perspective view schematically showing an example of a shield package of the present invention.
FIG. 1(b) is an enlarged view of a portion surrounded by the dashed line in FIG. 1(a).
FIG. 1(c) is a cross-sectional view taken along the line A-A in FIG. 1(b).
Figure 1:
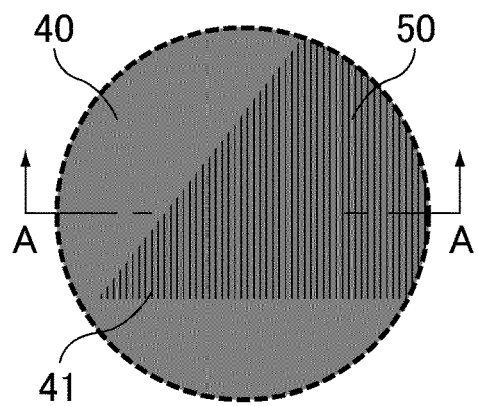
Figure 1:
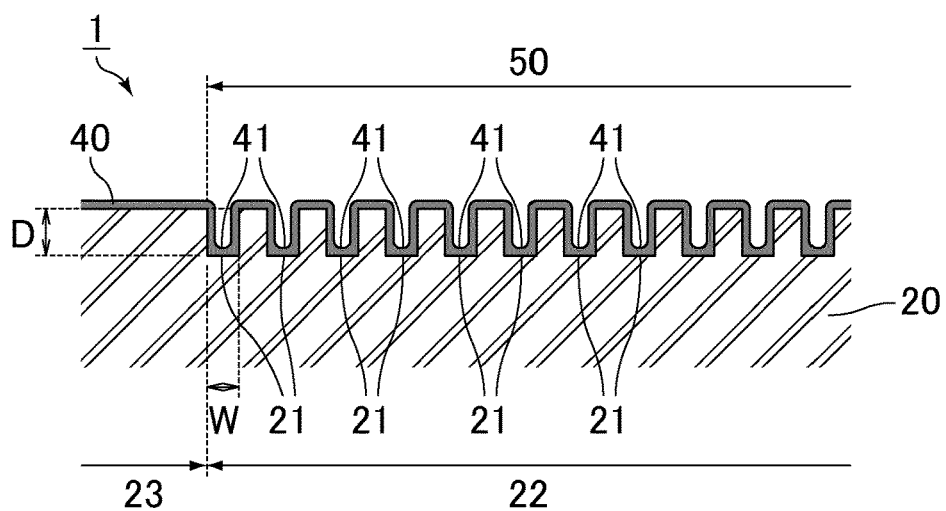

FIG. 1(a) is a perspective view schematically showing an example of the shield package of the present invention. FIG. 1(b) is an enlarged view of a portion surrounded by a dashed line in FIG. 1(a). FIG. 1(c) is a cross-sectional view taken along line A-A in FIG. 1(b).

As shown in FIG. 1(a), a shield package 1 includes a package 30 in which an electronic component 10 is sealed with a resin layer 20, and a shield layer 40 covering the package 30.

A pattern 50 is formed on the shield layer 40.

As shown in FIG. 1(b), the pattern 50 is drawn with lines by aggregation of depressions 41 formed on a surface of the shield layer 40.

As shown in FIG. 1(c), a surface of the resin layer 20 includes a drawing area 22 drawn with lines by aggregation of multiple grooves 21, and a non-drawing area 23 other than the drawing area 22.

The depressions 41 originating from the grooves 21 are formed on the surface of the shield layer 40 on the drawing area 22.

Here, a description is given on a shield package of a comparative technique in which a drawing area is formed with a single groove in a resin layer, and a shield layer is formed on the resin layer to form a depression so as to draw a single pattern with the single depression.

Figure 2:
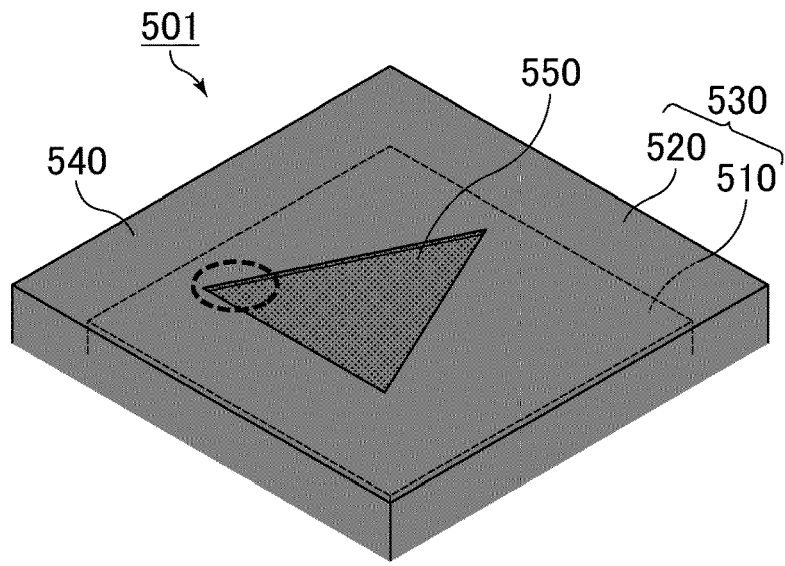
FIG. 2(a) is a perspective view schematically showing an example of a shield package of a comparative technique in which a single pattern is drawn on a shield layer with a single depression.
FIG. 2(b) is an enlarged view of a portion surrounded by a dashed line in FIG. 2(a).
FIG. 2(c) is a cross-sectional view taken along line B-B in FIG. 2(b).
Figure 2:
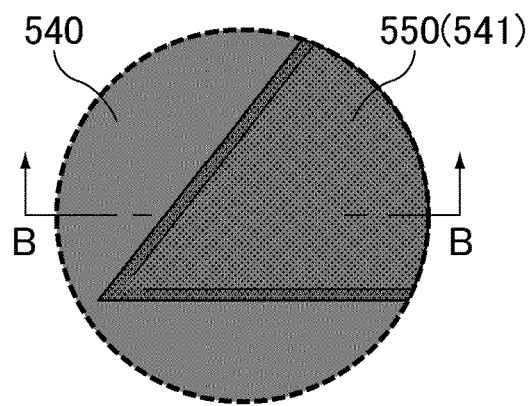
Figure 2:
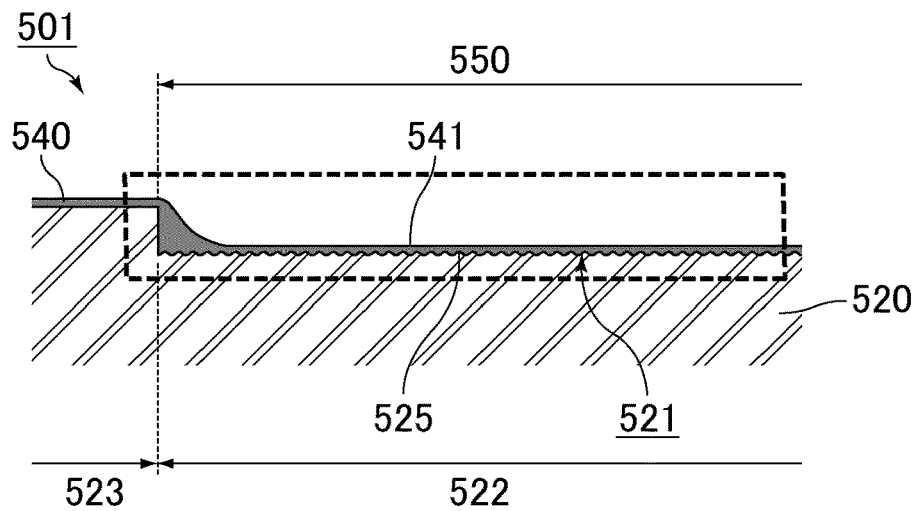

FIG. 2(a) is a perspective view schematically showing an example of the shield package of a comparative technique in which a single pattern is drawn on the shield layer with a single depression. FIG. 2(b) is an enlarged view of a portion surrounded by a dashed line in FIG. 2(a). FIG. 2(c) is a cross-sectional view taken along line B-B in FIG. 2(b).

As shown in FIG. 2(a), a shield package 501 includes a package 530 in which an electronic component 510 is sealed with a resin layer 520, and a shield layer 540 covering the package 530.

A pattern 550 is formed on the shield layer 540.

As shown in FIG. 2(b), the pattern 550 is formed with a single depression 541 formed on a surface of the shield layer 540.

In addition, as shown in FIG. 2(c), a groove 521 is formed in the resin layer 520, and a drawing area 522 is formed with the single groove 521.

The single groove 521 is formed by laser etching.

The single groove 521 has a bottom with fine irregularities 525 due to laser etching.

In addition, a single depression 541 originating from the groove 521 is formed on the surface of the shield layer 540 on the drawing area 522.

When producing the shield package 501 as described above, the groove 521 is first formed in the resin layer 520, and a conductive coating material is then applied to form the shield layer 540.

As shown in a portion surrounded by the dashed line in FIG. 2(c), the shield layer 540 formed on the fine irregularities 525 is made smooth by the leveling effect of the conductive coating material. As a result, the boundary of the depression 541 is not easily discernible, and the boundary of the pattern 550 is unclear.

In contrast, in the case of the shield package 1, the pattern 50 is drawn with lines on the surface of the shield layer 40 by aggregation of the multiple depressions 41.

The difference in brightness is large between the pattern 50 drawn with lines and/or dots and a portion other than the pattern due to the difference in reflectance. Thus, the pattern 50 has a clear boundary.

As a result, in the shield package 1, the pattern 50 is highly distinctive.

In the shield package 1, the width W of each groove (the distance indicated by "W" in FIG. 1(c)) is preferably 5 to 100 µm.

When the width W of each groove 21 is in the above range, the difference in brightness is clear between the pattern 50 drawn with lines on the surface of the shield layer 40 and the other portion.

When the width W of each groove 21 is less than 5 µm, the depressions 41 are less likely to be formed on the surface of the shield layer 40. As a result, the difference in brightness is small between the pattern 50 on the surface of the shield layer 40 and the other portion, making the pattern less distinguishable. In addition, the leveling effect of the conductive coating material makes the pattern less recognizable by a machine such as a reader.

When the width W of each groove 21 is more than 100 µm, the width of each depression 41 formed on the surface of the shield layer 40 is large, and there are fewer depressions 41 per unit area. Thus, there are fewer depressions 41 to draw the pattern 50.

As a result, the difference in brightness is small between the pattern 50 on the surface of the shield layer 40 and the other portion 50, making the pattern 50 less distinguishable.

In the shield package 1, the depth D of each groove (the distance indicated by "D" in FIG. 1(c)) is preferably 5 µm or more, more preferably 20 µm or more.

When the depth D of each groove 21 is 5 µm or more, the depressions 41 are clearly formed on the surface of the shield layer 40. Thus, the difference in brightness is clear between the pattern 50 drawn with lines on the surface of the shield layer 40 and the other portion.

In the shield package of the present invention, the grooves may have any form as long as the depressions can be formed on the surface of the shield layer.

For example, the grooves each may have a line shape or dot shape.

In particular, the line-shaped linear grooves are easily formed by laser marking.

Here, the shape of the grooves in the shield package of the present invention is described with reference to the drawings.

Figure 3:
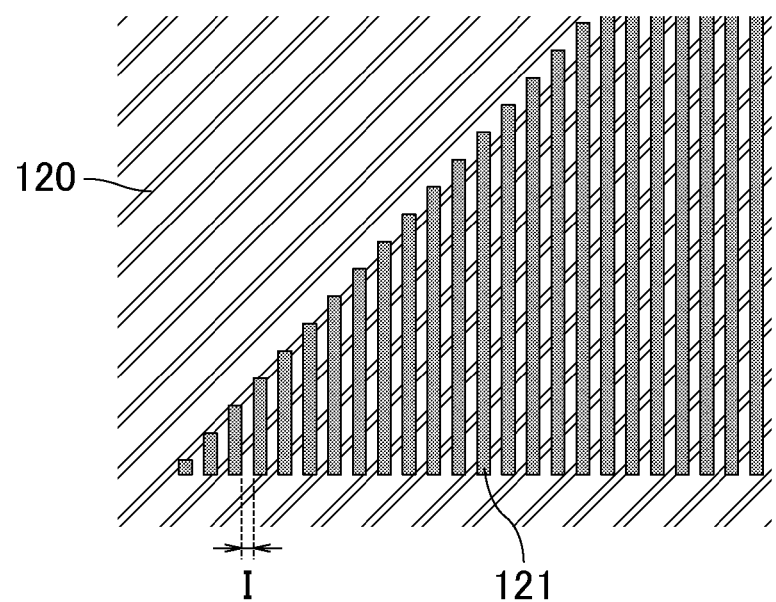
FIGS. 3(a) and 3(b) are top views each schematically showing an example of the shape of grooves formed in a resin layer of the shield package of the present invention.
Figure 3:
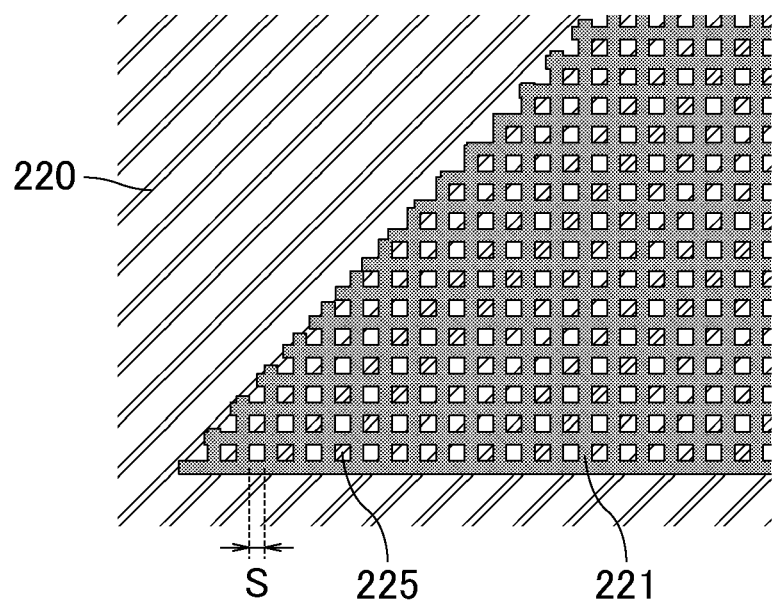

FIGS. 3(a) and 3(b) are top views each schematically showing an example of the shape of the grooves formed in the resin layer of the shield package of the present invention.

Grooves 121 are formed linearly and parallel to each other in a resin layer 120 shown in FIG. 3(a).

Each interval I (the distance indicated by "I" in FIG. 3(a)) between adjacent grooves 121 is equidistant.

The linear and parallel grooves 121 are simple shapes so that they can be efficiently formed.

In the resin layer 120, preferably, the grooves 121 adjacent to each other are arranged at an interval of 10 to 100 µm.

When each interval I between adjacent grooves 121 is in the above range, the difference in brightness is clear between the pattern drawn with lines on the surface of the shield layer and the other portion.

When each interval between adjacent grooves is less than 10 µm, the number of grooves to be formed per unit increases. Thus, many grooves need to be formed so that it takes time to form the grooves and it is thus inefficient. In addition, the leveling effect of the conductive coating material makes the pattern less recognizable by a machine such as a reader.

When each interval between adjacent grooves is more than 100 µm, the intervals between the depressions formed on the surface of the shield layer are large, and there are fewer depressions per unit area. Thus, there are fewer depressions to draw the pattern.

As a result, the difference in brightness is small between the pattern on the surface of the shield layer and the other portion, making the pattern less distinguishable.

While each interval I between the adjacent grooves 121 is equidistant in FIG. 3(a), in the shield package of the present invention, each interval between adjacent grooves may not necessarily be equidistant.

Grooves 221 are formed in a grid shape in a resin layer 220 shown in FIG. 3(b).

Cells of the grid formed by the grooves 221 have the same shape.

The grid-shaped grooves 221 can be easily formed by laser marking crosswise.

In the resin layer 220, the width S (the distance indicated by "S" in FIG. 3(b)) of each cell 225 of the grid formed by the grooves 221 is preferably 10 to 100 µm.

When the width S of each cell 225 is in the above range, the difference in brightness is clear between the pattern drawn with lines on the surface of the shield layer and the other portion.

When the width of each cell of the grid formed by the grooves is less than 10 µm, since number of grooves per unit area increase, many grooves need to be formed so that it takes time to form the grooves and it is thus inefficient. In addition, the leveling effect of the conductive coating material makes the pattern less recognizable by a machine such as a reader.

When the width of each cell of the grid formed by the grooves is more than 100 µm, the intervals between the depressions formed on the surface of the shield layer are large, and there are fewer depressions per unit area. Thus, there are fewer depressions to draw the pattern.

As a result, the difference in brightness is small between the pattern on the surface of the shield layer and the other portion, making the pattern less distinguishable.

While the cells of the grid formed by the grooves 221 have the same square shape in FIG. 3(b), in the shield package of the present invention, the cells of the grid formed by the grooves may have different shapes or may have rectangular shapes.

In the shield package of the present invention, the electronic component is not limited and may be a conventional electronic component for wireless communication.

In the shield package of the present invention, the material of the resin layer that seals the electronic component is not limited, and it may be a common resin material.

Examples of the resin material include epoxy resins, phenolic resins, silicone resins, unsaturated polyester resins, melamine resins, urea resins, diallyl phthalate resins, polyimide resins, and polyphenylene sulfide resins.

In the shield package of the present invention, the shield layer is not limited and may be formed from a common conductive coating material.

The shield layer may be formed from one or more resins serving as binder components and conductive particles.

Examples of the binder components forming the shield layer include epoxy resins, alkyd resins, melamine resins, xylene resins, and (meth)acrylate compounds.

Examples of the epoxy resins include bisphenol type epoxy resins such as bisphenol A type epoxy resins, bisphenol F type epoxy resins, and bisphenol S type epoxy resins; glycidyl ether epoxy resins such as spiro ring epoxy resins, naphthalene epoxy resins, biphenyl epoxy resins, terpene epoxy resins, tris(glycidyloxyphenyl)methane, and tetrakis (glycidyloxyphenyl)ethane; glycidylamine epoxy resins such as tetraglycidyldiaminophenylmethane; tetrabrom bisphenol A type epoxy resin; novolac epoxy resins such as cresol novolac epoxy resins, phenol novolac epoxy resins, α-naphthol novolac epoxy resins, and brominated phenol novolac epoxy resins; and rubber modified epoxy resins.

The (meth)acrylate compounds refer to acrylate compounds or methacrylate compounds, and may be any compounds having an acryloyl group or a methacryloyl group. Examples of the (meth)acrylate compounds include isoamyl acrylate, neopentyl glycol diacrylate, trimethylolpropane triacrylate, ditrimethylolpropane tetraacrylate, 2-hydroxy-3-acryloyloxypropyl methacrylate, phenyl glycidyl ether acrylate hexamethylene diisocyanate urethane prepolymer, adducts of acrylic acid with bisphenol A diglycidyl ether, ethylene glycol dimethacrylate, and diethylene glycol dimethacrylate.

Examples of the conductive particles forming the shield layer include metal particles such as copper particles, silver particles, nickel particles, silver-coated copper particles, gold-coated copper particles, silver-coated nickel particles, and gold-coated nickel particles.

The shape of the metal particles is not limited, and may be spherical, flaky (scaly), branching, or fibrous.

The spherical particles include not only substantially true spherical particles (atomized powder) but also substantially spherical particles such as substantially polyhedral spherical particles (reduced powder) and irregular shaped particles (electrolyte powder).

The shield layer is formed from a cured product of a conductive coating material containing a curing agent, and thus may contain a component derived from the curing agent.

The shield layer may contain known additives such as defoamers, thickeners, adhesives, fillers, flame retardants, and colorants, if necessary.

In the shield package of the present invention, preferably, the shield layer has a thickness of 3 to 15 µm.

When the thickness of the shield layer is less than 3 µm, the shielding performance tends to be insufficient.

When the thickness of the shield layer is more than 15 µm, the distance between the grooves and the surface of the shield layer is large so that the depressions are less likely to be formed due to the leveling effect.

As a result, the difference in brightness is small between the pattern on the surface of the shield layer and the other portion, making the pattern less distinguishable.

In the shield package of the present invention, the pattern on the surface of the shield layer may be a simple pattern or one that indicates distinctive information such as a letter or a mark.

When the pattern includes letters, the letters may show a product model number, a lot number, a manufacturing date, or the like. When the pattern includes letters, preferably, the letters are visible.

The distinctive information may be a two-dimensional code, for example.

When the pattern is a two-dimensional code, preferably, the pattern is readable with a reader (e.g., Honeywell Barcode Scanner Xenon 1902 Series).

Next, an example of the method of producing a shield package of the present invention is described.

The method of producing a shield package of the present invention includes: (1) a package preparing step; (2) an intended drawing area determining step; (3) a drawing area forming step; and (4) a shield layer forming step.

Each step is described below with reference to the drawings.

Figure 4:
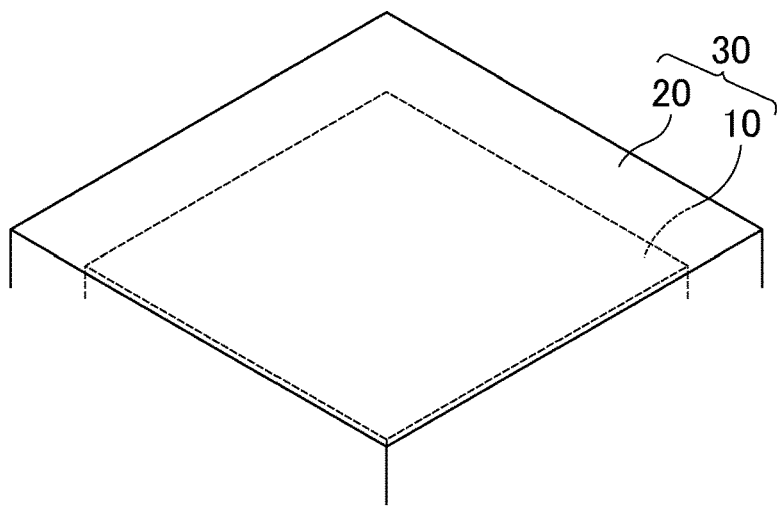
FIG. 4 is a view schematically showing an example of a package preparing step of a method of producing a shield package of the present invention.

FIG. 4 is a view schematically showing an example of the package preparing step of the method of producing a shield package of the present invention.

Figure 5:
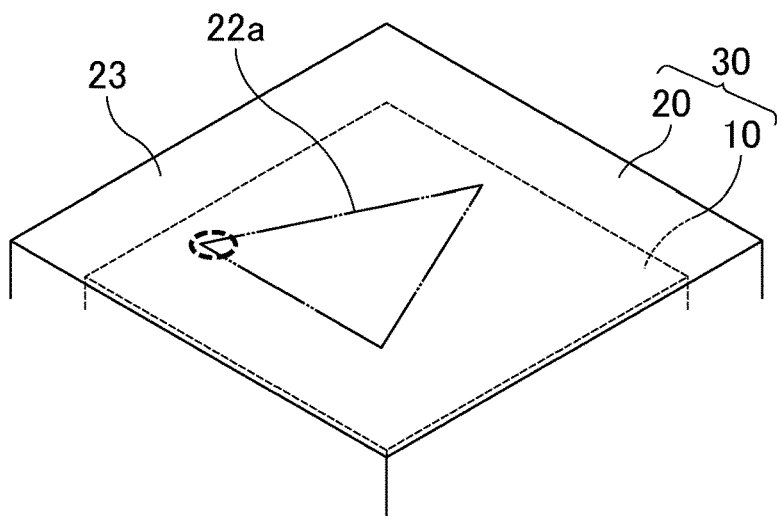
FIG. 5 is a view schematically showing an example of an intended drawing area determining step of the method of producing a shield package of the present invention.

FIG. 5 is a view schematically showing an example of the intended drawing area determining step of the method of producing a shield package of the present invention.

Figure 6:
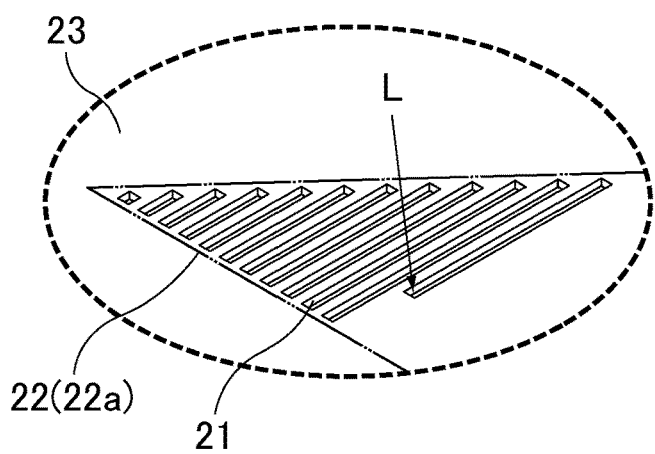
FIG. 6 is an enlarged view of a portion surrounded by a dashed line in FIG. 5, and is a view schematically showing an example of a drawing area forming step of the method of producing a shield package of the present invention.

FIG. 6 is an enlarged view of a portion surrounded by a dashed line in FIG. 5, and is a view schematically showing an example of the drawing area forming step of the method of producing a shield package of the present invention.

Figure 7:
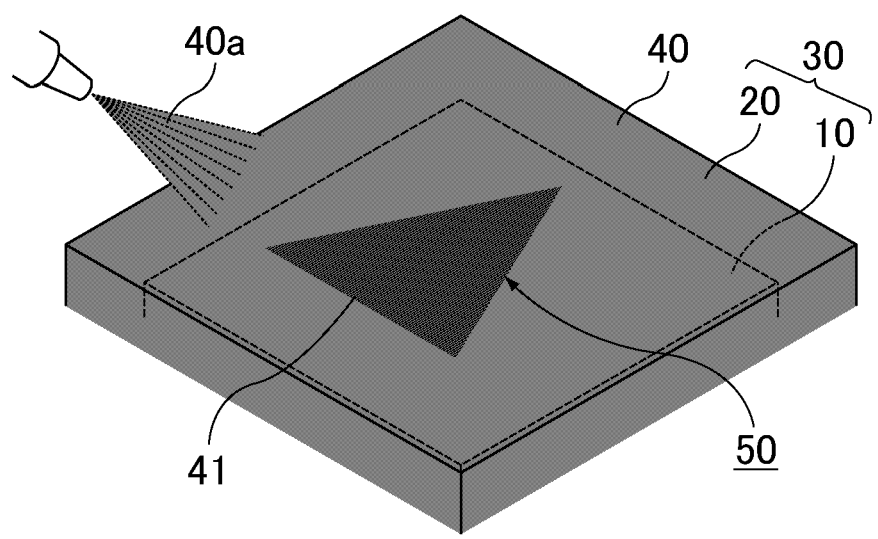
FIG. 7 is a view schematically showing an example of a shield layer forming step of the method of producing a shield package of the present invention.

FIG. 7 is a view schematically showing an example of the shield layer forming step of the method of producing a shield package of the present invention.

(1) Package Preparing Step

First, as shown in FIG. 4, the package 30 in which the electronic component 10 is sealed with the resin layer 20 is prepared.

The type of the electronic component and the material of the resin layer have been already described, and descriptions thereof are thus omitted.

(2) Intended Drawing Area Determining Step

Next, as shown in FIG. 5, an intended drawing area 22a and the non-drawing area 23 other than the intended drawing area 22a are determined on the surface of the resin layer 20.

(3) Drawing Area Forming Step

Next, as shown in FIG. 6, a laser beam L is applied to the intended drawing area 22a to form the multiple line-shaped grooves 21 in such a manner that these line-shaped linear grooves 21 are aggregated to draw the drawing area 22 with lines.

While the drawing area 22 is drawn with lines using the line-shaped grooves 21 in FIG. 6, dot-like grooves may be formed to draw the drawing area with dots in the method of producing a shield package of the present invention.

The width and depth of each groove to be formed in the intended drawing area can be controlled by adjusting the output and moving speed of the laser.

Preferred width, depth, shape, and the like of the grooves have been already described, and descriptions thereof are thus omitted.

(4) Shield Layer Forming Step

Next, as shown in FIG. 7, a conductive coating material 40a is applied to the surface of the resin layer 20 to form the shield layer 40.

In this step, the line-shaped depressions 41 originating from the line-shaped grooves 21 are formed in such a manner that these depressions 41 are aggregated to draw the pattern 50 with lines.

In FIG. 7, the line-shaped depressions 41 originating from the line-shaped grooves 21 are formed. As described above, in the method of producing a shield package of the present invention, dot-like grooves may be formed in the drawing area forming step. In this case, dot-like depressions are formed so that the pattern is drawn with dots by the dot-like depressions.

In this step, the method of applying the conductive coating material is not limited. Examples include spraying, screen printing, and dipping. Of these, spraying is preferred because a shield layer having a uniform thickness is easily obtained.

The thickness of the shield layer can be adjusted by controlling the spraying time and the like to adjust the amount of the conductive coating material to be applied.

The conductive coating material used in this step is described.

The conductive coating material contains binder components, conductive particles, and a curing agent.

Preferred types of the binder components and the conductive particles are the same as the preferred types of the binder components and the conductive particles forming the shield layer, and descriptions thereof are thus omitted.

The amount of the conductive particles is preferably 500 to 1800 parts by weight, more preferably 550 to 1800 parts by weight, relative to the total 100 parts by weight of the binder components.

Examples of the curing agent include phenolic curing agents, imidazole curing agents, amine curing agents, cationic curing agents, and radical curing agents.

Examples of the phenolic curing agents include novolac phenol and naphthol compounds.

Examples of the imidazole curing agents include imidazole, 2-undecylimidazole, 2-heptadecylimidazole, 2-methylimidazole, 2-ethylimidazole, 2-phenylimidazole, 2-ethyl-4-methyl-imidazole, 1-cyanoethyl-2-undecylimidazole, and 2-phenylimidazole.

Examples of the cationic curing agents include amine salts of boron trifluoride and onium compounds such as p-methoxybenzene diazonium hexafluorophosphate, diphenyliodonium hexafluorophosphate, triphenylsulfonium, tetra-n-butylphosphonium tetraphenylborate, and tetra-n-butylphosphonium-o,o-diethylphosphorodithioate.

Examples of the radical curing agents (polymerization initiators) include di-cumyl peroxide, t-butyl cumyl peroxide, t-butyl hydroperoxide, and cumene hydroperoxide.

The amount of the curing agent is different depending on the type of the curing agent, but usually, it is preferably 0.3 to 40 parts by weight, more preferably 0.5 to 35 parts by weight, relative to the total 100 parts by weight of the binder components.

The conductive coating material may contain a solvent such as methyl ethyl ketone, if necessary.

EXAMPLES

The present invention is described in detail below based on examples, but the present invention is not limited to these examples.

Example 1

(1) Package Preparing Step

A model package having a size of 1 cm (length)×1 cm (width) was prepared in which a model IC was sealed with a resin layer formed from a thermosetting epoxy resin.

(2) Intended Drawing Area Determining Step

An intended drawing area for a two-dimensional code and a non-drawing area other than the intended drawing area were determined on a surface of the resin layer of the model package.

(3) Drawing Area Forming Step

Next, using a laser marker ("LodeStone" available from ESI), multiple grooves were formed in the intended drawing area to form a drawing area with a laser output of 0.3 W and a laser engraving width of 4.0 μm at a laser moving speed of 400 mm/s.

The grooves were formed linearly and parallel to each other, with each interval between adjacent grooves being equidistant.

Each groove had a width of 10 μm and a depth of 40 μm. Each interval between adjacent grooves was 30 μm.

(4) Shield Layer Forming Step

First, a conductive coating material with the following composition was prepared.

<Composition of Conductive Coating Material>
Binder components (epoxy resin)
Product name "JER157S70" available from Mitsubishi Chemical Corporation, 20 parts by weight
Product name "EP-3905S" available from ADEKA Corporation, 30 parts by weight
Product name "EP-4400" available from ADEKA Corporation, 50 parts by weight
Conductive particles
Silver-coated copper alloy particles (average particle size: 5 μm; flaky; aspect ratio: 2 to 10), 1000 parts by weight
Curing agents
Phenolic novolac (product name "Tamanol 758" available from Arakawa Chemical Industries, Ltd.), 15 parts by weight 2-Methylimidazole (product name "2MZ-H" available from Shikoku Chemicals Corporation), 5 parts by weight
Solvent
3-Methoxy-3-methyl-1-butyl acetate, 24 wt %

Next, the conductive coating material was applied by spraying under the following conditions, whereby a 7-μm thick shield layer was formed on the surface of the resin layer of the model package.

<Spray conditions> SL-940E available from Nordson Asymtek Paste extrusion pressure: 2.8 Psi
Asist air (Atomized air): 5 Psi
Package surface temperature: 22° C.
Distance between package surface and nozzle: about 15 cm
Spray head moving pitch: 5 mm
Spray head moving speed: 500 mm/sec
Number of times to spray: 4 times
Curing conditions: 20 minutes of standing in dryer at 160° C.

By these steps, a model shield package according to Example 1 was produced in which the multiple depressions originating from the grooves were formed on the shield layer, and the two-dimensional code was drawn with lines by aggregation of the depressions.

Example 2

A model shield package according to Example 2 was produced as in Example 1, except that each width between adjacent grooves formed in the resin layer was 15 μm.

Comparative Example 1

A model shield package according to Comparative Example 1 was produced as in Example 1, except that in "(3) Drawing area forming step" described above, lines and a pattern to form a two-dimensional code were formed in the intended drawing area with a single groove having a depth of 40 μm.

(Two-Dimensional Code Reading Test)

The two-dimensional codes formed on the model shield packages according to Example 1, Example 2, and Comparative Example 1 were subjected to a reading test using "Honeywell Barcode Scanner Xenon 1902 Series".

As a result, the two-dimensional codes on the model shield packages according to Example 1 and Example 2 were readable, but the two-dimensional code on the model shield package according to Comparative Example 1 was unreadable.

REFERENCE SIGNS LIST 1, 101, 201, 501 shield package
10, 110, 210, 510 electronic component
20, 120, 220, 520 resin layer
21, 121, 221, 521 groove
22, 522 drawing area
22a intended drawing area
23 non-drawing area
30, 530 package
40, 540 shield layer
40a conductive coating material
41, 541 depressions
50, 550 pattern
225 cell
525 fine irregularities

The invention claimed is:

1. An individualized shield package comprising:
an individual electronic package in which an electronic component is sealed with a resin layer; and
a shield layer covering the individual electronic package,
wherein a major surface of the resin layer includes a drawing area drawn with hatching formed by an aggregation of multiple linear, parallel grooves to form a product-identifying pattern, and a non-drawing area other than the drawing area,
multiple depressions originating from the grooves are formed on regions of an outer, major surface of the shield layer overlying the drawing area, and
the depressions are aggregated to form a product-identifying representation of the product-identifying pattern on the outer, major surface of the shield layer.

2. The shield package according to claim 1, wherein the grooves adjacent to each other are arranged at an interval of 10 to 100 μm.

3. The shield package according to claim 1, wherein at least some of the multiple grooves are formed in a grid shape.

4. The shield package according to claim 3, wherein each cell of the grid formed by the grooves has a width of 10 to 100 μm.

5. The shield package according to claim 1, wherein each groove has a width of 5 to 100 μm.

6. The shield package according to claim 1, wherein each groove has a depth of 5 μm or more.

7. The shield package according to claim 1, wherein the pattern is a two-dimensional code.

8. A method of producing an individualized shield package including an individual electronic package in which an electronic component is sealed with a resin layer, and a shield layer covering the package, the method comprising:
a package preparing step of preparing a package in which an electronic component is sealed with a resin layer;
a drawing area forming step of forming hatching from an aggregation of multiple linear, parallel grooves by applying a laser beam to a major surface of the resin layer in such a manner that the grooves are aggregated to form a product-identifying pattern; and a shield layer forming step of applying a conductive coating material to the major surface of the resin layer to form a shield layer, wherein the shield layer forming step includes forming depressions originating from the grooves on regions of an outer major surface of the shield layer in such a manner that the depressions are aggregated to form a representation of the product-identifying pattern on the outer, major surface of the shield layer.

* * * * *